United States Patent
Milo et al.

(10) Patent No.: US 9,824,959 B2
(45) Date of Patent: Nov. 21, 2017

(54) STRUCTURE AND METHOD FOR STABILIZING LEADS IN WIRE-BONDED SEMICONDUCTOR DEVICES

(71) Applicant: Texas Instruments Incorporated, Dallas, TX (US)

(72) Inventors: Dolores Babaran Milo, Baguio (PH); Mark Gerald Rosario Pinlac, Angeles (PH); Bobby Johns Lansangan Villacarlos, Cabuyao (PH); Jerry Gomez Cayabyab, Baguio (PH); Juan Carlo Aro Rimando, La Trinidad (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/078,071

(22) Filed: Mar. 23, 2016

(65) Prior Publication Data

US 2017/0278776 A1  Sep. 28, 2017

(51) Int. Cl.
*H01L 23/495* (2006.01)
*H01L 23/00* (2006.01)
(Continued)

(52) U.S. Cl.
CPC .... *H01L 23/49582* (2013.01); *H01L 21/4853* (2013.01); *H01L 23/293* (2013.01); *H01L 23/3121* (2013.01); *H01L 23/49541* (2013.01); *H01L 24/05* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 2224/04042* (2013.01); *H01L 2224/32245* (2013.01); *H01L 2224/45124* (2013.01); *H01L 2224/45144* (2013.01); *H01L 2224/45147* (2013.01); *H01L 2224/48091* (2013.01); *H01L 2224/48106* (2013.01); *H01L 2224/48245* (2013.01); *H01L 2224/48463* (2013.01);
(Continued)

(58) Field of Classification Search
CPC ............ H01L 23/49582; H01L 23/293; H01L 23/3121; H01L 23/49541
USPC ........................................................ 257/676
See application file for complete search history.

(56) References Cited

U.S. PATENT DOCUMENTS 6,025,640 A * 2/2000 Yagi ..................... H01L 21/4828
257/666
6,166,430 A * 12/2000 Yamaguchi ......... H01L 23/3121
257/666

(Continued)

*Primary Examiner* — Nitin Parekh
(74) *Attorney, Agent, or Firm* — Jacqueline J. Garner; Charles A. Brill; Frank D. Cimino

(57) ABSTRACT

A semiconductor device having a leadframe including a pad (101) surrounded by elongated leads (110) spaced from the pad by a gap (113) and extending to a frame, the pad and the leads having a first thickness (115) and a first and an opposite and parallel second surface; the leads having a first portion (112) of first thickness near the gap and a second portion (111) of first thickness near the frame, and a zone (114) of reduced second thickness (116) between the first and second portions; the second surface (112a) of the first lead portions is coplanar with the second surface (111a) of the second portions. A semiconductor chip (220) with a terminal is attached the pad. A metallic wire connection (230) from the terminal to an adjacent lead includes a stitch bond (232) attached to the first surface of the lead.

15 Claims, 4 Drawing Sheets

(51) Int. Cl.
*H01L 23/31* (2006.01)
*H01L 21/48* (2006.01)
*H01L 23/29* (2006.01)

(52) U.S. Cl.
CPC ............. *H01L 2224/73265* (2013.01); *H01L 2224/8582* (2013.01); *H01L 2224/92247* (2013.01); *H01L 2924/01028* (2013.01); *H01L 2924/0132* (2013.01); *H01L 2924/01046* (2013.01); *H01L 2924/01079* (2013.01); *H01L 2924/01403* (2013.01); *H01L 2924/1776* (2013.01); *H01L 2924/17724* (2013.01); *H01L 2924/17747* (2013.01)

(56) References Cited

U.S. PATENT DOCUMENTS

| | | | | |
|---|---|---|---|---|
| 6,400,004 B1* | 6/2002 | Fan | ...................... | H01L 23/3107 257/666 |
| 6,713,849 B2* | 3/2004 | Hasebe | ................ | H01L 23/3107 257/667 |
| 6,965,157 B1* | 11/2005 | Perez | .................. | H01L 21/4842 257/666 |
| 7,087,462 B1* | 8/2006 | Park | ....................... | H01L 21/561 257/666 |
| 7,968,998 B1* | 6/2011 | Choi | ................. | H01L 23/49541 257/666 |
| 8,933,548 B2* | 1/2015 | Oda | ......................... | H01L 24/97 257/669 |
| 2012/0009737 A1* | 1/2012 | Kuratomi | .............. | H01L 21/561 438/112 |
| 2012/0126378 A1* | 5/2012 | San Antonio | ......... | H01L 21/561 257/659 |
| 2014/0103510 A1* | 4/2014 | Andou | ................... | H01L 23/49551 257/676 |
| 2014/0124912 A1* | 5/2014 | Kaneda | .................... | H01L 24/49 257/676 |
| 2016/0254214 A1* | 9/2016 | Makino | .................... | H01L 24/97 257/676 |

* cited by examiner

STRUCTURE AND METHOD FOR STABILIZING LEADS IN WIRE-BONDED SEMICONDUCTOR DEVICES

FIELD

Embodiments of the invention are related in general to the field of semiconductor devices and processes, and more specifically to the structure of leadframes and methods of bonding and molding operations by self-supporting leads and temporary compliant interfaces.

DESCRIPTION OF RELATED ART

In a frequently practiced technique in semiconductor device fabrication, the semiconductor chip is attached to the pad of a leadframe and then the chip terminals are connected to respective leads by wire bonding technology using wires made of copper, gold, or aluminum, with diameters of about 25 µm. In the wire bonding process using an automated bonder, the wire is strung through a ceramic capillary with a fine bore suitable for guiding the metal wire. At the wire end extruding from the capillary tip, a free air ball is created by melting the wire end using either a flame or a spark technique. The ball has a typical diameter of about 1.5 wire diameters. Moving the capillary towards a chip terminal, the soft ball is pressed against the metallization of the pad by a compression force often combined with ultrasonic movement of the ball relative to the pad, transmitting ultrasonic energy. The bonding process results in a metal nail head or squashed ball attached to the chip pad by intermetallic compounds (intermetallic bond).

After the ball attachment, the capillary with the wire is lifted to span an arch from the ball to a lead of the leadframe. The leadframe has been fabricated earlier by stamping or etching from a metallic sheet; long leads have been produced frequently by a by a half-etching technique. When the wire touches the lead surface, the capillary tip is pressed against the wire in order to flatten it against the lead and thus to form a stitch (or wedge) bond to the lead. The attachment process forms metal interdiffusions or welds (diffusion bond). Based on the geometric shape of the capillary tip, the capillary leaves an imprint in the flattened portion of the attached wire. The capillary rises again to a height sufficient to display a length of wire with enough metal to form the next ball. Then, a tear method is initiated to break the wire near the end of the stitch bond and leave the exposed wire length dangling from the capillary tip ready for the next ball-forming melting step.

Recent applications required that semiconductor devices offer patterns of conductive traces different on the top leadframe surface from the pattern on the bottom leadframe surface. A popular technique to create these different trace patterns is the so-called half-etching (partial etching) process of leadframes. As a side effect of half-etching, elongated leads may lose about half of their thickness for a portion of their lengths with the consequence that in the stitch bonding process the half-etched leads may not be able to withstand the pressure exerted by the capillary against the wire; the leads become bent or damaged.

In order to create mechanical support, the whole leadframe may be subjected to a pre-molding process, wherein the spaces surrounding half-etched long leads are filled in with a polymeric compound and thus stiffened. However, these so-called pre-molded leadframes are expensive.

SUMMARY

When applicants studied electrical failures in packaged semiconductor devices, they encountered as root cause of poor stitch bond adhesion or even lifted stitch bonds in wire-bonded devices using leadframes with half-etched elongated leads. Analysis showed that the unstable bonding of a wire to a lead was due to a gap between the elongated lead and the heater block, onto which the lead had been placed for support during the stitch bond process. The gap induced micro-bouncing of the lead with the result of a lifted wire at the stitch or poor stitch adhesion. The gap, in turn, originated either from a lead, which was produced at the lower limit of the etching tolerance during the process of half-etching the lead, or from a lead, which tilted on the heater block, because the lead originated from the upper limit of the etching tolerance. In the latter failure mode, even the molding operation of the packaging process could produce failures, because a tilted lead could allow mold resin to creep on the exposed lead and cause resin flashing during the encapsulation.

Applicants solved the problem of failing stitch bonds when they discovered a methodology which offers a solution in cases which require immediate remedy, and also in cases which allow enough time to modify the lead configuration of the leadframe.

The short term remedy comprises a method wherein a compliant compensator is placed on the heater block employed to pre-heat the leadframe with the attached chip in order to reach the temperature required for the ball bonding process. A compensator such as a polyimide-based compliant polymer is custom-shaped to support the plurality of half-etched elongated leads during the bonding process so that the lead surface-to-be-bonded becomes coplanar with the pad surface onto which the chip has been attached.

The solution for creating reliable stitch bonds involves a modification of the leadframe structure. In the leadframe, a pad is surrounded by elongated leads, which are spaced from the pad by a gap and extend to the frame. A support of the leadframe metal is added to the tip of the lead near the gap so that the lead can rest vibration-free on the hot stage throughout the stitch bonding process. In an embodiment of the support structure, the pad and the leads are made from a base metal sheet with a first thickness and a first and an opposite and parallel second surface, wherein the leads have a first portion of first thickness near the gap and a second portion of first thickness near the frame, and a zone of reduced second thickness between the first and second portions. In this embodiment, the first lead portions have a first surface with bondable metallurgy and a second surface coplanar with the second surface of the second portions.

DETAILED DESCRIPTION OF THE PREFERRED EMBODIMENTS

Figure 1A:
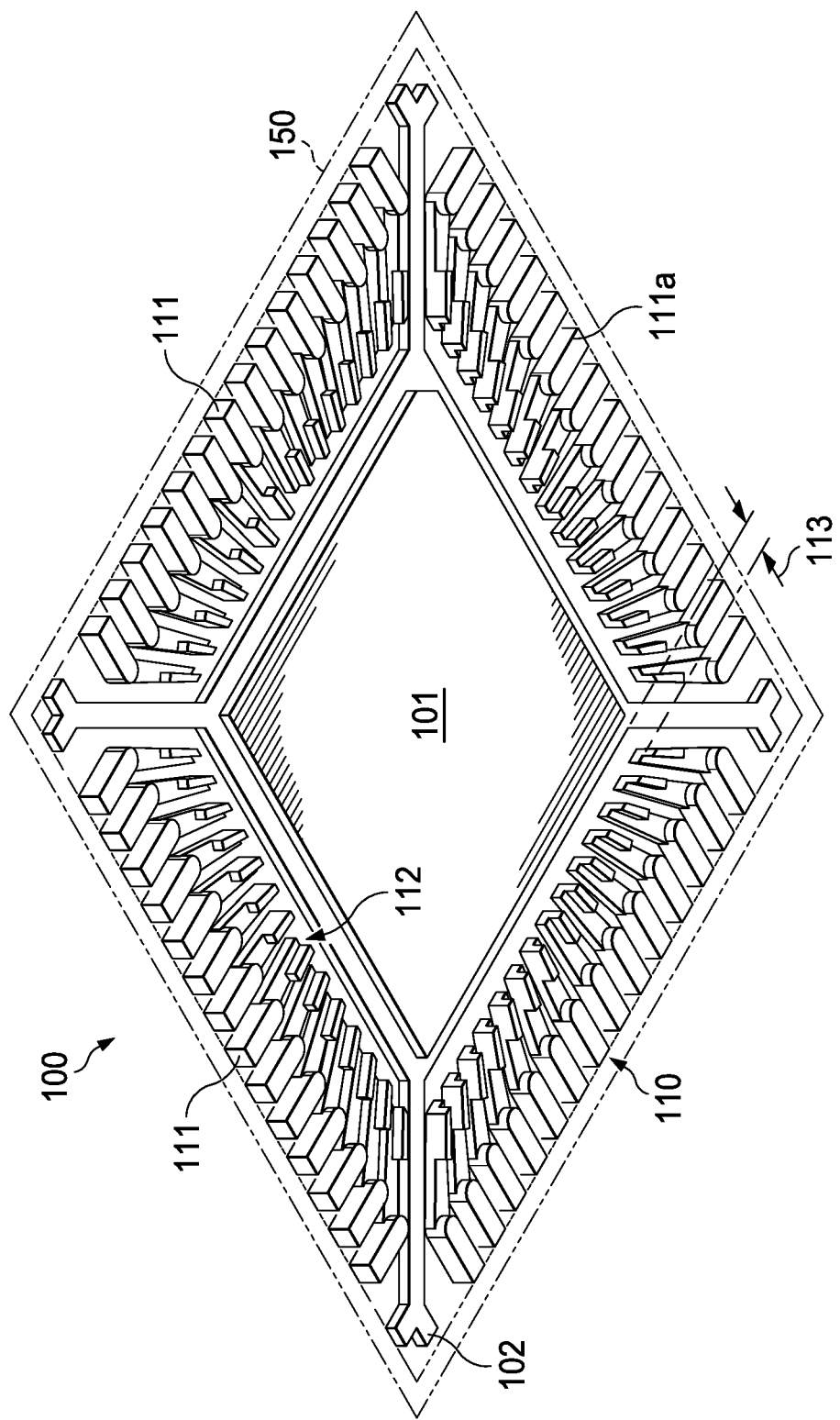
FIG. 1A shows a perspective bottom view of an exemplary leadframe with structures according to the invention stabilizing elongated leads for the wire bonding process.

Embodiments of the invention are found in devices with semiconductor chips assembled on a support such as a metallic leadframe and encapsulated in a package of a polymeric compound. FIG. 1A illustrates an exemplary embodiment comprising a leadframe designated 100 as used for the assembly of semiconductor chips in semiconductor device fabrication. Leadframe 100 is viewed from the bottom perspective.

Figure 1B:
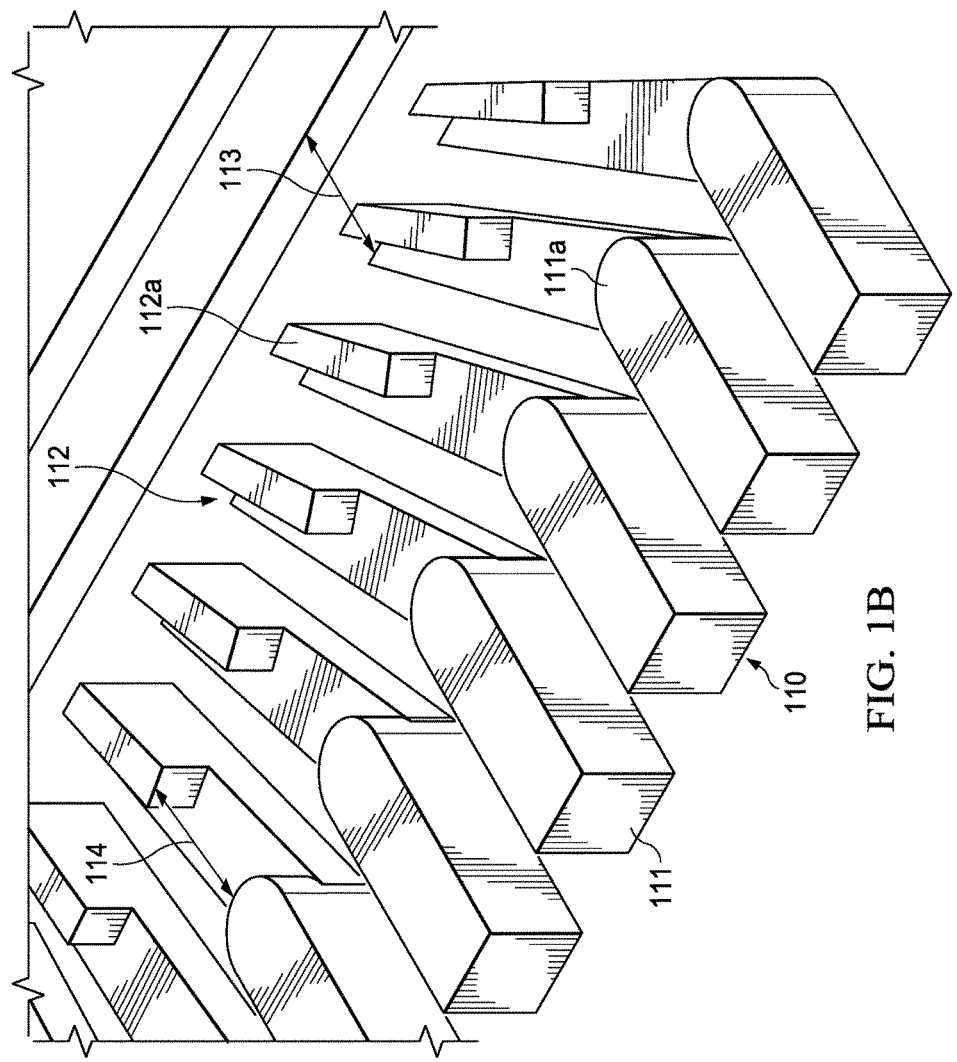
FIG. 1B illustrates a magnified view of a portion of the leadframe of FIG. 1A.

Leadframe 100 includes a pad 101 for assembling a semiconductor chip, tie bars or straps 102 connecting pad 101 to the frame 150, and a plurality of elongated leads 110 surrounding pad 101. As FIGS. 1A and 1B show, one end 112 of elongated leads 110 faces pad 101, but is spaced from pad 101 by a gap 113. In the example of FIG. 1A, leads 110 are shaped as elongated flat leads with one flat end 111 remote and facing away from pad 101. End 111 is thickened and has a surface 111a, which will protrude from the encapsulating material of the eventual package; such leads are used in Quad Flat No-Lead (QFN) devices or in Small Outline No-Lead (SON) devices. The protruding surface of the flat end is designated 111a in FIG. 1B. It should be noted that in some device families straps 102 may include bendings and steps, since pad 101 and leads 110 may not be in the same plane.

Leadframes are preferably made from a flat sheet of a base metal, which is selected from a group including copper, copper alloys, aluminum, aluminum alloys, iron-nickel alloys, and Kovar. For many devices, the parallel surfaces of the leadframe base metal are treated to create strong affinity for adhesion to plastic compound, especially molding compounds. As an example, the surfaces of copper leadframes may be oxidized, since copper oxide surfaces are known to exhibit good adhesion to molding compounds. Other methods include plasma treatment of the surfaces, or deposition of thin layers of other metals on the base metal surface. As an example for copper leadframes, plated layers of tin have been used, or a layer of nickel (about 0.5 to 2.0 µm thick) followed by a layer of palladium (about 0.01 to 0.1 µm thick) optionally followed by an outermost layer of gold (0.003 to 0.009 µm thick).

The enlargement of a few leads in FIG. 1B illustrates that leads 110 have an end piece 112 facing the gap 113 towards pad 101. The surface 112a of thickened end piece 112 is coplanar with surface 111a of thickened end piece 111 (thickness 115). This is a consequence of the fact that surfaces 111a and 112a originate from the surface of the original metal sheet, which was continuous before creating the downset 114 (by etching, stamping, or coining). Forming the thinned zones 114 (thickness 116) serves the double purpose of generating surface contours, which may be different on one lead surface compared to the opposite surface, and creating more area and mechanical grips for enhancing adhesion between polymeric package compounds and metallic leadframe surfaces.

Figure 2:
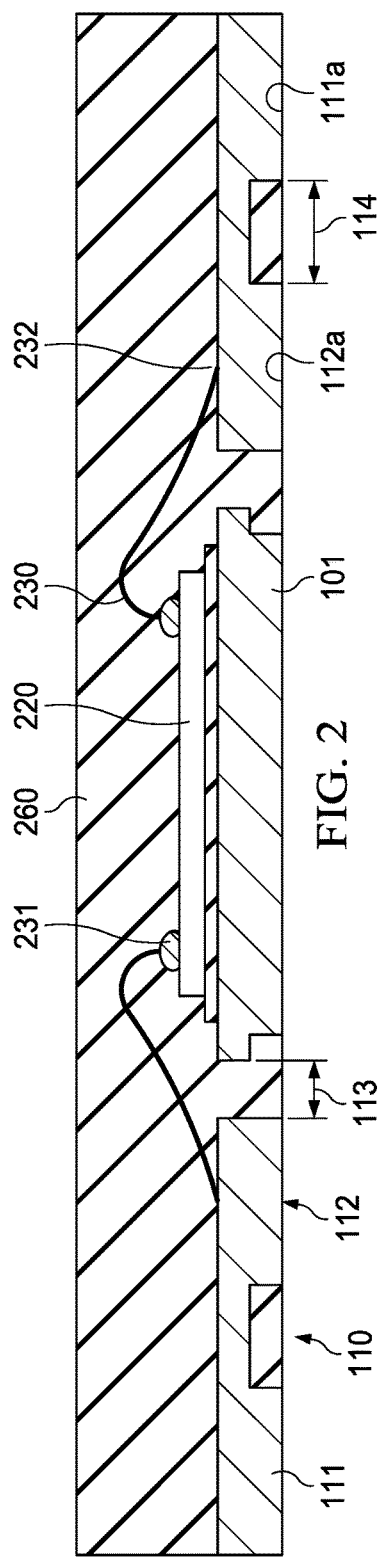
FIG. 2 depicts a cross section of a wire bonded and packaged semiconductor device with a leadframe having elongated leads with stabilizing structures for the wire bonding process.

As illustrated in FIG. 2, exemplary leadframe 100 is intended for wire bonding, specifically ball bonding, to electrically interconnect the terminals of chip 220 and leads 110. The wires 230 used for bonding are preferably made of copper, gold, aluminum, and alloys thereof, and have diameters of approximately 25 µm. The wires, the chip and portions of the leadframe pad and leads are encapsulated in a package 260 preferably made of a filler-filled polymeric compound.

Figure 3:
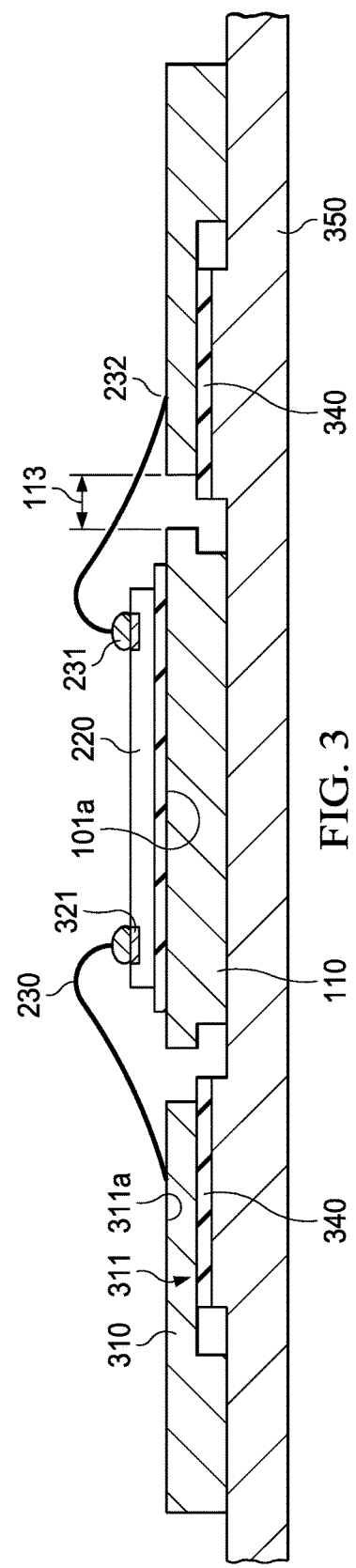
FIG. 3 illustrates the process of wire bonding a semiconductor chip assembled on a leadframe, which is placed on a heater block with features to support elongated leads during the wire bonding process.

As indicated in FIG. 3, a wire bonding process may begin with positioning the semiconductor chip on a heated pedestal 350 to raise the temperature to between 150 and 300° C. For copper and aluminum wires, ball formation and bonding may need to be performed in a reducing atmosphere such as dry nitrogen gas with a few percent hydrogen gas. For the process. The wire is strung through the capillary of an automated bonder. A capillary is an elongated tube of an inert material such as a ceramic with a fine bore (the capillary in the strict sense) suitable for guiding a metal wire in the 15 to 33 µm diameter range. At the wire end extruding from the capillary tip, a free air ball is created by melting the wire end using either a flame or a spark technique. The ball has a typical diameter from about 1.2 to 1.6 wire diameters. The capillary is moved towards a chip terminal 321 as an attachment pad. Terminal 321 may be an alloy of aluminum and copper. The soft ball is pressed against the metallization of pad 321 by a compression force, often combined with ultrasonic movement of the ball relative to the pad, transmitting ultrasonic energy and forming layers of intermetallic compounds thickness between about 50 and 100 nm). The compression (also called Z- or mash) force is typically between about 17 and 75 gram-force/cm$^2$ (about 1670 to 7355 Pa); the ultrasonic time between about 10 and 30 ms; the ultrasonic power between about 20 and 50 mW. The bonding process results in a metal nail head or squashed ball 231 with intermetallic compounds ("intermetallic bond").

In contrast to ball bonds, the stitch bonds 232 (sometimes referred to as wedge bonds) are created by pressing wire 230 against the metal of the lead, preferably copper or plated layers of palladium or gold. For the temperature of the leads somewhat lower than the heated pedestal (i.e., between 150 and 300° C.), only metal interdiffusion is created for the stitch bonds, since ultrasonic agitation is not provided. It should be pointed out that herein this type of bond is referred to as "diffusion bond" in distinction to intermetallic bond. Based on the geometric shape of the capillary tip, the capillary leaves an imprint in the flattened portion of the attached wire. The wire portion with the transition from the round wire to the flattened wire is bent and is called the heel of the stitch bond.

As stated, the interdiffusion to be achieved for a successful stitch bond requires that pressure to the wire is applied by the capillary, and that lead 310 is able to withstand this pressure. Otherwise for leads 310, which have a portion 311 both elongated and reduced in thickness (by half-etching), the resilient strength of portion 311 may not be sufficient to counterbalance the pressure. If a product development cycle would not allow enough time to redesign the leads for including thickened end 112 (see FIG. 1B), then an alternative support for leads 311 can summarily obtained by a compensating material 340 positioned under the end portion 311 of elongated lead 310.

Material 340 is a heat-tolerant and non-adhesive polymer, which can be easily formed (for instance by cutting configurations from a polymeric sheet) to fit on a hot stage in a geometrical configuration suitable to support the plurality of half-etched leads during the process of attaching the stitch bonds to the leads. The material needs to be compliant enough so that its height can be adjusted under pressure (by the capillary) to compensate any height difference among the leads caused by the half-etch process. The polymeric material behaves as a self-adjuster or an auto compensator. As a consequence, all leads appear at the same correct height in the stitch attach process and thus allow a reliable stitch bond formation.

In the example of FIG. 3, the polymeric material 340 may be formed as a square-shaped ring resting on hot stage 350 to support the half-etched leads 311 on all four sides surrounding pad 101 spaced by gap 113 (see FIG. 1A). When the capillary exerts pressure on a lead 311 for forming the stitch bond, surface 311a of lead 311 is substantially coplanar with surface 101a of pad 101.

After the stitch bond attachment, the capillary may break off the wire. or the capillary with the wire may be lifted to span an arch 204 from the ball 203 to a pad 205 on a substrate or a leadframe. When the wire touches the pad surface, the capillary tip is pressed against the wire in order to flatten it and thus to form a stitch bond 206, sometimes referred to as a wedge bond.

The capillary rises again to a height sufficient to display a length of wire with enough metal to form the next ball. Then, a tear method is initiated to break the wire near the end of the stitch bond and leave the exposed wire length dangling from the capillary tip ready for the next ball-forming melting step. Various wire-breaking methods are commonly employed, among them the so-called clamp-tear method and the table-tear method.

Standardized bond pull tests, with pulls measured in gram-force, are used to gauge the strength of the ball bonds and the stitch bonds. The pull tests to measure the quality of the bonds may be repeated by pull tests to measure the reliability after any of the numerous standardized accelerated life tests, moisture tests, and electrical stress tests.

Figure 4:
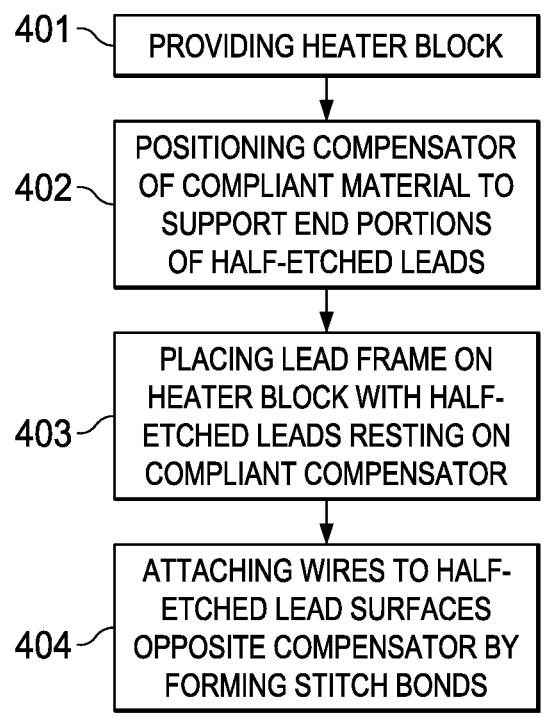
FIG. 4 is a diagram of the process flow for fabricating fail-safe stitch bonds on half-etched leads using a compliant compensator on the heater block.

Another embodiment of the invention is a method for stabilizing leads in wire-bonded semiconductor devices, summarized in FIG. 4. The method starts with process 401 by providing a heater block suitable to mechanically support the leadframe during the bonding processes and provide the heat to bring the leadframe to the prescribed temperature.

In the next process 402, pieces of a sheet-like, heat-tolerant, non-adhesive, and compliant polymeric material are positioned on the heater block so that the pieces can support the end-portions of half-etched leads of a leadframe. The pieces are tailored to fit under groups of the half-etched leads while keeping a gap to the leadframe pad with the attached semiconductor chip. In its position as lead supporter, the material is compliant enough to compensate for any overetching or underetching of the leads and thus bring about, under the pressure of the bonder capillary, the necessary resistive strength coupled with co-planarity between the surfaces of the leads and the chip pad.

In process 403, the leadframe is placed on the heater block so that the half-etched leads are resting on the compliant compensator and obtain the support necessary to compensate any over- or under-etching of the leads. Some heater blocks offer the support for half-etched leads partially as a hard support, such as a step of the heater block, and partially as the compliant compensator.

In process 404, stitch bond are formed by attaching bonding wires to the half-etched lead surfaces opposite the compensator. As stated, under the pressure on the wire and the leads by the capillary, the surfaces of the leads and the pad (311a and 101a respectively in FIG. 3) become substantially coplanar. It should be pointed out, however, that in other leadframes the surfaces of leads and pad may be in different planes, intentionally separated by a step in order to guarantee uphill bonding for preventing wire shorts to the semiconductor chip.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to active semiconductor devices with low and high pin counts, such as transistors and integrated circuits, but also to combinations of active and passive components on a leadframe pad.

As another example, the invention applies not only to silicon-based semiconductor devices, but also to devices using gallium arsenide, gallium nitride, silicon germanium, and any other semiconductor material employed in industry. The invention applies to QFN and SON type leadframes and to leadframes with cantilevered leads.

As another example, the invention applies to leadframes, laminated substrates, and any other substrate or support structure, which includes a conductor with a locally reduced thickness such as a cantilevered lead and a metallurgical surface configuration suitable for metal interdiffusion and welding.

It is therefore intended that the appended claims encompass any such modifications or embodiments.

We claim:

1. A leadframe comprising:
   a metallic pad surrounded by a plurality of leads spaced from the metallic pad by a gap, each of the plurality of leads including a first surface and an opposite second surface, the first surface being adapted to connect a bond wire;
   wherein each of the plurality of leads including a first portion near the gap, a second portion and a third portion separated from the first portion by the second portion, wherein the first portion includes two sections across a width of the lead, a first section with a first thickness and a second section with a second thickness different than the first thickness, the second portion includes the second thickness, and the third portion includes the first thickness.

2. The leadframe of claim 1, wherein the metallic pad and the plurality of leads include a base metal selected from a group consisting of copper, copper alloys, aluminum, aluminum alloys, iron-nickel alloys, and Kovar.

3. The leadframe of claim 2, wherein the first surface includes a layer of nickel plated on the base metal and a layer of palladium plated on the nickel layer, and a layer of gold plated on the palladium layer.

4. The leadframe of claim 1, wherein the second portion is offset from the opposite second surface.

5. The leadframe of claim 1, wherein a surface of the first section and a surface of the third portion are coplanar.

6. The leadframe of claim 1, wherein the second thickness is lesser than the first thickness.

7. The leadframe of claim 1, wherein each of the plurality of leads extends to a frame.

8. The leadframe of claim 1, wherein the first portion is closer to the metallic pad than the second portion and the third portion.

9. The leadframe of claim 1, wherein the first portion is between an end of the lead and a point where the section with the first thickness and the section with the second thickness end, and wherein the third portion is at another end of the lead.

10. A semiconductor device comprising:
    a metallic pad; and
    a semiconductor chip, attached to the metallic pad, and electrically connected to a first surface of each of a plurality of leads, each of the plurality of leads including an opposite second surface and being spaced from the metallic pad by a gap;

wherein each of the plurality of leads including a first portion near the gap, a second portion and a third portion at an end opposite the gap, the second portion between the first portion and the third portion, wherein the first portion includes two sections across a width of the lead, a first section with a first thickness and a second section with a second, different thickness, the second portion includes the second thickness and the third portion includes the first thickness, and wherein the second portion is offset from the opposite second surface.

11. The device of claim 10 wherein the semiconductor chip is electrically connected to the first surface of each of the plurality of leads via wire connections, and wherein the wire connection on the first surface includes a stitch bond.

12. The device of claim 11 further including a package of a polymeric compound covering portions of the semiconductor chip, wire connection, and at least a portion of each of the plurality of leads.

13. The leadframe of claim 11, wherein the wire connection on a surface of the semiconductor chip includes a ball bond.

14. The leadframe of claim 10, wherein a surface of the first section and a surface of the third portion are coplanar.

15. The leadframe of claim 10, wherein the second thickness is lesser than the first thickness.

* * * * *